United States Patent
Satake

(10) Patent No.: US 10,614,149 B2
(45) Date of Patent: Apr. 7, 2020

(54) COORDINATE INFORMATION CONVERSION DEVICE AND COMPUTER READABLE MEDIUM

(71) Applicant: FANUC CORPORATION, Minamitsuru-gun, Yamanashi (JP)

(72) Inventor: Yoshikazu Satake, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/885,014

(22) Filed: Jan. 31, 2018

(65) Prior Publication Data
US 2018/0225257 A1 Aug. 9, 2018

(30) Foreign Application Priority Data

Feb. 7, 2017 (JP) .................................. 2017-020424

(51) Int. Cl.
*G06F 17/16* (2006.01)
*G05B 19/402* (2006.01)
(Continued)

(52) U.S. Cl.
CPC .......... *G06F 17/16* (2013.01); *G05B 19/402* (2013.01); *G06F 3/011* (2013.01); *G06T 19/006* (2013.01);
(Continued)

(58) Field of Classification Search
None
See application file for complete search history.

(56) References Cited

U.S. PATENT DOCUMENTS

| 7,403,648 B2 | 7/2008 | Nakamura |
| 9,501,872 B2 | 11/2016 | Ito |

(Continued)

FOREIGN PATENT DOCUMENTS

| CN | 105872526 | 8/2016 |
| CN | 106101689 | 11/2016 |

(Continued)

OTHER PUBLICATIONS

Zhang et al. (A multi-regional computation scheme in an AR-assisted in situ CNC simulation environment, Computer-Aided Design, Jun. 2010, Elsevier) (Year: 2010).*

(Continued)

*Primary Examiner* — Kyle Zhai
(74) *Attorney, Agent, or Firm* — Wenderoth, Lind & Ponack, L.L.P.

(57) ABSTRACT

A coordinate information conversion device includes: calculation means for acquiring a plurality of pieces of image data obtained by capturing a set of positions including a position of a fixed object and a position of a movable part of a machine tool and calculating values of undefined numbers included in a predetermined conversion equation on the basis of the acquired plurality of pieces of image data; and first conversion means for converting a coordinate value in a first coordinate system which is a coordinate system for controlling driving of the movable part to a coordinate value in a second coordinate system which is a coordinate system for representing virtual information and is a coordinate system based on the position of the fixed object on the basis of the predetermined conversion equation of which the values of the undefined numbers are calculated by the calculation means.

7 Claims, 11 Drawing Sheets

(51) Int. Cl.
  *G06T 19/00* (2011.01)
  *G06F 3/01* (2006.01)
(52) U.S. Cl.
  CPC ............ *G05B 2219/32014* (2013.01); *G05B 2219/36167* (2013.01)

(56) References Cited

U.S. PATENT DOCUMENTS

| | | | |
|---|---|---|---|
| 2004/0107018 A1 | 6/2004 | Nakamura | |
| 2009/0093905 A1* | 4/2009 | Otsuki | G05B 19/4086 700/174 |
| 2012/0327187 A1* | 12/2012 | Troy | G01N 29/0654 348/46 |
| 2015/0022552 A1 | 1/2015 | Ito | |
| 2016/0232715 A1 | 8/2016 | Lee | |

FOREIGN PATENT DOCUMENTS

| | | |
|---|---|---|
| CN | 106249694 | 12/2016 |
| CN | 106324836 | 1/2017 |
| JP | 4083554 | 4/2008 |
| JP | 2009-266221 | 11/2009 |
| JP | 5872923 | 3/2016 |
| JP | 2018-92476 | 6/2018 |

OTHER PUBLICATIONS

Park et al. (Invisible Marker Tracking for AR, 2004, IEEE) (Year: 2004).*
Hirokazu Kato et al., "An Augmented Reality System and its Calibration based on Marker Tracking", TVRSJ, vol. 4, 1999 (with English abstract and concise explanation).
Office Action dated Feb. 3, 2019 in CN Patent Application No. 2.01810107962.5.
Kiswanto et al., "Development of Augmented Reality (AR) for Machining Simulation of 3-axis CNC Milling", ICACSIS, 2013, pp. 143-148.
Office Action dated Jul. 30, 2019 in DE Patent Application No. 102018201210.5.

* cited by examiner

FIG. 1
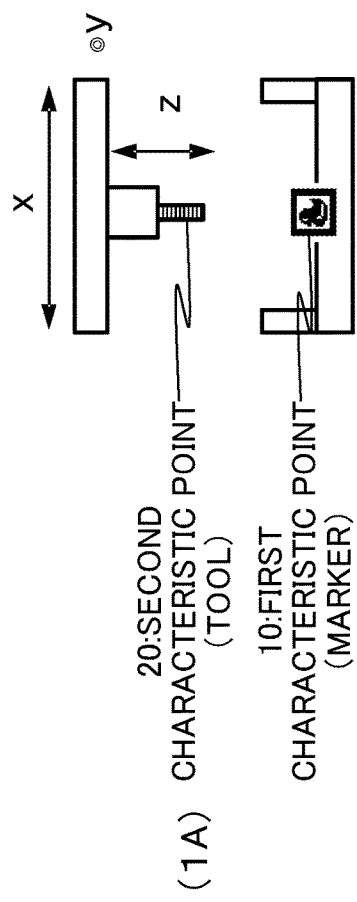
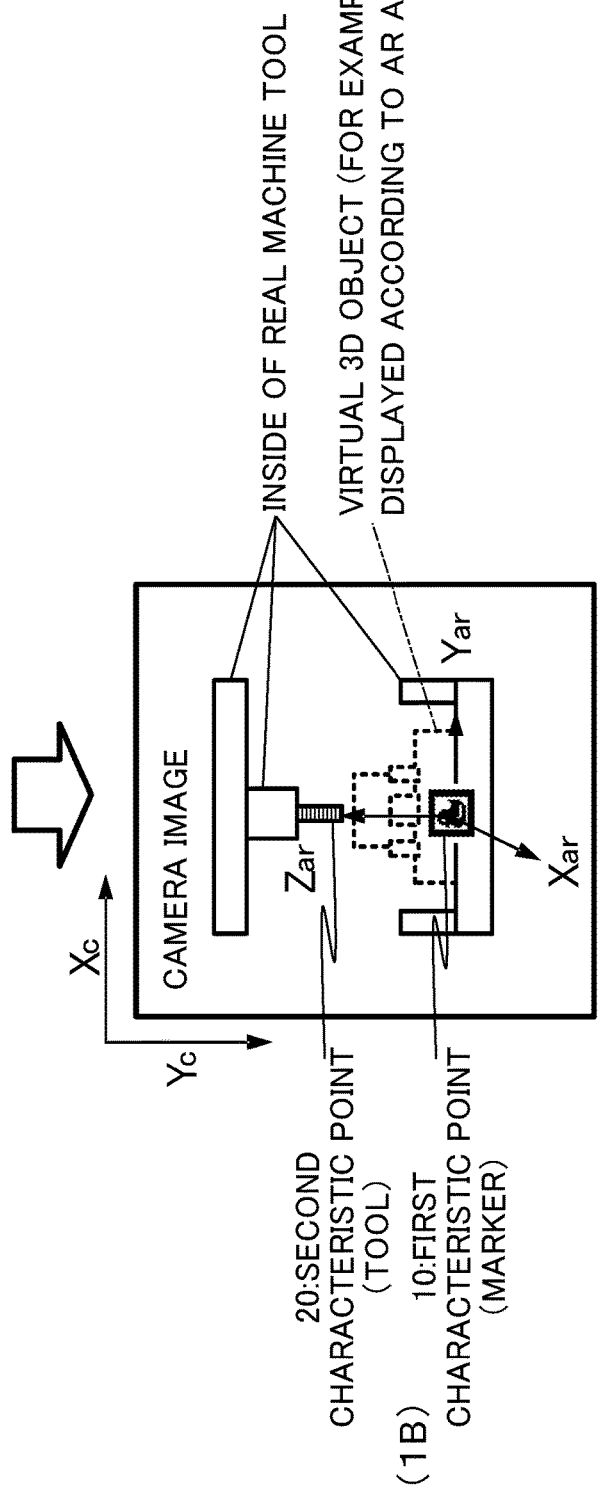

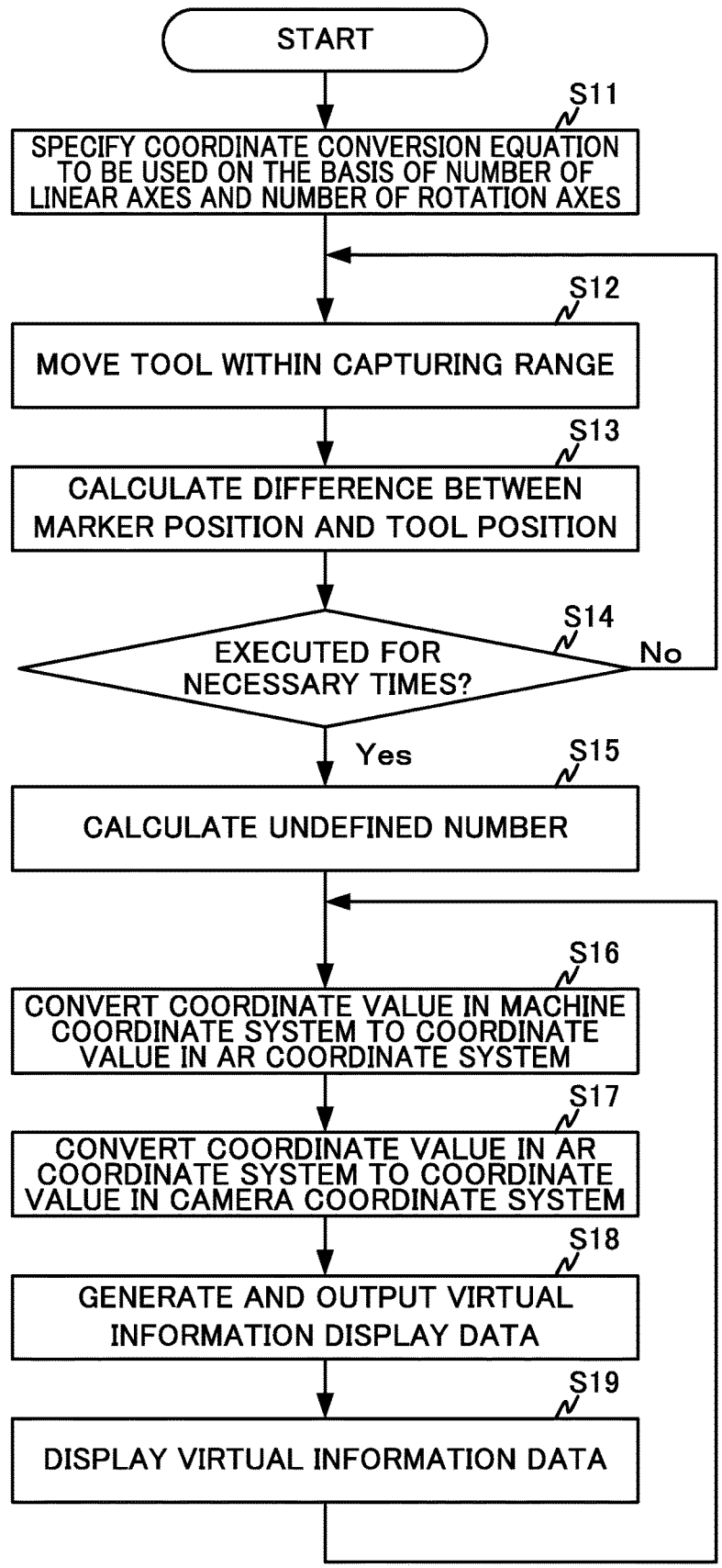

FIG. 5

| NUMBER OF LINEAR AXES | NUMBER OF ROTATION AXES | COORDINATE CONVERSION EQUATION |
|---|---|---|
| 1 | 0 | $X_{ar} = R(x + T_1) + T$ |
| 2 | 0 | $X_{ar} = R(x + T_1 + T_2) + T$ |
| ... | ... | ... |
| n | 0 | $X_{ar} = R(x + T_1 + T_2 + \cdots + T_n) + T$ |
| 1 | 1 | $X_{ar} = R(R_1 x + T_1) + T$ |
| ... | ... | ... |
| n | 1 | $X_{ar} = R(R_1 x + T_1 + T_2 + \cdots + T_n) + T$ |
| ... | ... | ... |

$X_{ar}$ : AR COORDINATE SYSTEM   T, R : CONVERSION MATRIX FROM MACHINE COORDINATE SYSTEM TO AR COORDINATE SYSTEM x : VECTOR OF INITIAL POSITION OF CHARACTERISTIC POINT $T_1, \cdots, T_n, R_1$ : MACHINE COORDINATE SYSTEM FIG. 12
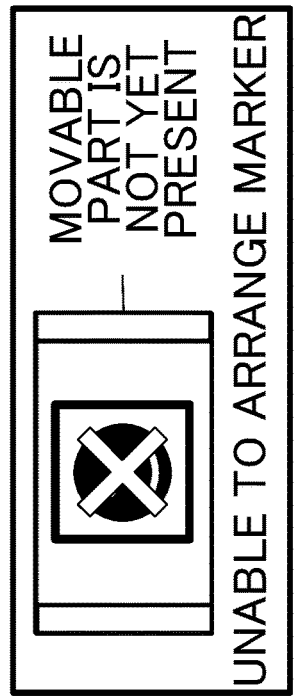
(12C)
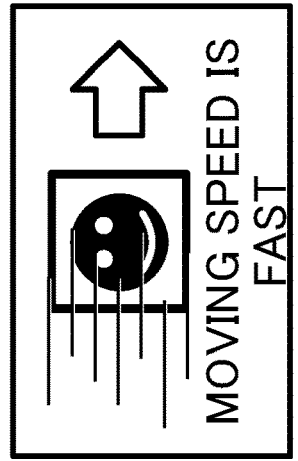
(12B)
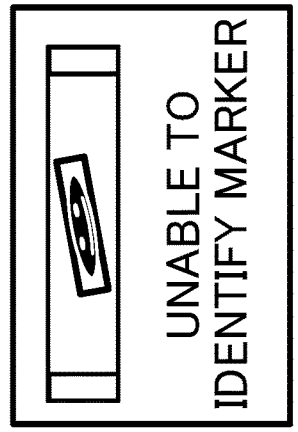
(12A)

COORDINATE INFORMATION CONVERSION DEVICE AND COMPUTER READABLE MEDIUM

This application is based on and claims the benefit of priority from Japanese Patent Application No. 2017-020424, filed on 7 Feb. 2017, the content of which is incorporated herein by reference.

BACKGROUND OF THE INVENTION

Field of the Invention

The present invention relates to a coordinate information conversion device and a computer readable medium for converting coordinate information for the purpose of displaying information, for example.

Related Art

Conventionally, in the field of a machine tool controlled by a numerical controller, a work or a jig is designed by a computer-aided design (CAD) or the like. Moreover, a machining program for machining a work using a designed jig is created. A numerical controller controls a machine tool on the basis of a machining program whereby machining of a work is realized.

Here, machining simulation is generally performed to check whether a designed jig or work and a machining program are appropriate before the jig or work and the machining program are actually loaded on a manufacturing line.

When this machining simulation is performed to check operations of a real machine, machining simulation is naturally not performed until a real jig is completed. Therefore, it causes a problem that the process is delayed until a jig is completed.

Moreover, when a problem such as interference is found at the time of checking operations after a jig is completed and it is necessary to change the design of the jig, the process is delayed further. Moreover, the cost for changing the jig design also incurs. If the jig design is not changed, it is necessary to change the machining program. In this case, the cycle time required for machining may be extended more than as expected.

With these problems in view, a technology of performing machining simulation virtually by arithmetic processing of such as a personal computer rather than checking operations of a real machine is known. For example, in a technology disclosed in Patent Document 1, all structures of a machine tool are realized as virtual 3D objects and machining simulation is performed.

However, in the technology disclosed in Patent Document 1, it is necessary not only to create a virtual 3D object of a work or a jig and but also to create virtual 3D objects of an entire machine.

On the other hand, in the field of recent image processing technologies, technologies such as augmented reality (AR) or mixed reality (MR) for displaying virtual objects so as to be superimposed on objects present in a real space are generally used. In the following description, information such as virtual objects displayed by these technologies such as AR or MR will be referred to as "virtual information."

When technologies such as AR or MR are used, it is possible to extract specific characteristic points (for example, markers) of an image captured by a camera and to represent virtual information such as virtual objects using a coordinate system based on the characteristic points. In this way, it is possible to display the virtual information so as to be superimposed on an image of a real machine tool as an overlay. Therefore, it is possible to solve the problems of the technology disclosed in Patent Document 1 in which it is necessary to create virtual 3D objects of the entire machine tool.

A basic technology such as AR or MR is disclosed in Non-Patent Document 1. In the technology disclosed in Non-Patent Document 1, a see-through-type head-mounted display (HMD) is used as a display device, and a 3-dimensional position of a marker serving as reference coordinates for displaying virtual objects is detected from image information obtained by a small camera attached to the HMD. A video image of a virtual object which gives a parallax to both eyes of a user is presented so that a virtual 3D object can be displayed as a 3-dimensional object in a real 3-dimensional space seen through a HMD screen.

Specifically, in the technology disclosed in Non-Patent Document 1, a plurality of coordinate systems illustrated in FIG. 9 is employed. Specifically, a virtual 3D object is represented on a marker coordinate system which is a coordinate system having the origin as a characteristic point. Moreover, a process of calculating a coordinate conversion matrix for converting a marker coordinate system to a camera coordinate system is performed. By using the coordinate conversion matrix obtained by this process, it is possible to draw a virtual 3D object at an appropriate position of the screens on the left and right sides of a HMD.

Moreover, in this case, as illustrated in FIG. 10, when a marker registered in advance is used as a characteristic point for displaying a virtual 3D object, and then, the marker is moved, the virtual 3D object also moves following movement of the marker. That is, the virtual 3D object follows the marker.

By disposing a marker on a movable part of a real machine tool using this technology, it is possible to move a virtual 3D object so as to follow actual movement of a table. For example, as indicated by (11A) on the left side of FIG. 11, a marker is disposed on a movable table which is a movable part of a real machine tool. Moreover, as indicated by (11B) at the center of FIG. 11, a virtual 3D object is displayed using the marker as the origin. Furthermore, as indicated by (11C) on the right side of FIG. 11, when the movable table is moved along an X-axis, for example, the virtual 3D object moves along the X-axis following the marker.

By using the technology of AR, MR, and the like disclosed in Non-Patent Document 1 and the like, it is possible to perform machining simulation without realizing the entire machine tool as a virtual 3D object.

Patent Document 1:
Japanese Patent No. 4083554
Patent Document 2:
Japanese Patent No. 5872923
Non-Patent Document 1:
"An Augmented Reality System and its Calibration based on Marker Tracking", [online], [Retrieved on Jan. 25, 2017], Internet <URL: http://intron.kz.tsukuba.ac.jp/tvrsj/4.4/kato/p-99_VRSJ4_4.pdf>

SUMMARY OF THE INVENTION

However, when a marker is disposed on a movable part of a real machine tool as illustrated in FIG. 11, a plurality of problems occurs. This problem will be described with reference to FIG. 12.

As a premise, it is necessary to identify a marker using a camera in order to display virtual information. However, as indicated by (12A) on the left side of FIG. 12, for example, there is a problem that it may be unable to identify the marker due to movement or rotation of a movable part on which the marker is disposed. In this respect, when the technology disclosed in Patent Document 2 is used, it is possible to continue displaying virtual information even after it became unable to identify the marker. However, in the technology disclosed in Patent Document 2, since it is not possible to detect movement of the marker disposed on the movable part after it became unable to identify the marker, the virtual information being displayed does not move after it became unable to identify the marker. Therefore, even when the technology disclosed in Patent Document 2 is used, it is not possible to perform machining simulation appropriately if it is unable to identify the marker.

Moreover, as indicated by (12B) at the center of FIG. 12, there is a problem that the moving speed of a movable part is too fast to recognize the marker.

Moreover, as indicated by (12C) on the right side of FIG. 12, there is a problem that it may be unable to dispose the marker on the movable part, in the first place. A case in which it is unable to dispose the marker on the movable part is a case in which the movable part itself is realized as a virtual 3D object, for example.

In consideration of these problems, it is preferable that, when a virtual 3D object is displayed on a machine tool as an overlay and machining simulation is performed, a marker is fixedly placed at a predetermined position without moving the marker itself.

However, when the marker is fixedly placed, a virtual 3D object displayed using the marker as the origin does not move. In this case, it is not possible to perform machining simulation. In the general technology described above, it is sometimes difficult to displays virtual information such as virtual 3D objects appropriately.

Therefore, an object of the present invention is to provide a coordinate information conversion device and a coordinate information conversion program capable of performing a process for displaying virtual information appropriately.

(1) A coordinate information conversion device (for example, a coordinate information conversion device 200 to be described later) according to the present invention includes: calculation means (for example, a calculation unit 210 to be described later) for acquiring a plurality of pieces of image data (for example, image data D1 to be described later) obtained by capturing a set of positions including a position of a fixed object (for example, a first characteristic point 10 to be described later) and a position of a movable part (for example, a second characteristic point 20 to be described later) of a machine tool (for example, a machine tool 400 to be described later) and calculating values of undefined numbers included in a predetermined conversion equation on the basis of the acquired plurality of pieces of image data; and first conversion means (for example, a first conversion unit 220 to be described later) for converting a coordinate value (for example, a machine-coordinate-system coordinate value D2 to be described later) in a first coordinate system which is a coordinate system for controlling driving of the movable part to a coordinate value (for example, an AR-coordinate-system coordinate value D4 to be described later) in a second coordinate system which is a coordinate system for representing virtual information and is a coordinate system based on the position of the fixed object on the basis of the predetermined conversion equation (for example, an undefined-number-calculation coordinate conversion equation D3 to be described later) of which the values of the undefined numbers are calculated by the calculation means.

(2) The coordinate information conversion device according to (1) may further include: second conversion means (for example, a second conversion unit 230 to be described later) for representing the virtual information on the basis of the coordinate value in the second coordinate system converted by the first conversion means and converting the coordinate value in the second coordinate system converted by the first conversion means to a coordinate value in a third coordinate system which is a coordinate system for displaying the virtual information to thereby generate display data (for example, virtual information display data D5 to be described later) for displaying the virtual information in the third coordinate system; and display means (for example, a head-mounted display 300 to be described later) for displaying the configuration information on the basis of the display data generated by the second conversion means.

(3) In the coordinate information conversion device according to (2), when the movable part of the machine tool is driven actually by transmitting the coordinate value in the first coordinate system to the machine tool, the first conversion means may convert a coordinate value the same as the coordinate value in the first coordinate system transmitted to the machine tool to a coordinate value in the second coordinate system, and the display means may display the virtual information so as to be interlocked with the driving of the movable part of the machine tool.

(4) In the coordinate information conversion device according to any one of (1) to (3), when the position of the fixed object is a first characteristic point and the position of the movable part is a second characteristic point, the calculation means may calculate the values of the undefined numbers by substituting a coordinate value in the second coordinate system calculated on the basis of a difference between the first characteristic point and the second characteristic point and the coordinate value in the first coordinate system transmitted to the machine tool into the predetermined conversion equation.

(5) In the coordinate information conversion device according to any one of (1) to (4), the movable part may perform rotational movement on the basis of the coordinate value in the first coordinate system, the predetermined conversion equation may further include an undefined number corresponding to the rotational movement, and the first conversion means may convert the coordinate value in the first coordinate system to the coordinate value in the second coordinate system on the basis of the predetermined conversion equation of which the values of all undefined numbers including the value of the undefined number corresponding to the rotational movement are calculated by the calculation means.

(6) In the coordinate information conversion device according to any one of (1) to (5), the fixed object may be placed in an arbitrary place within a capturing range of a capturing device that performs the capturing.

(7) A coordinate information conversion program according to the present invention is a coordinate information conversion program for causing a computer to function as an coordinate information conversion device (for example, a coordinate information conversion device 200 to be described later) including: calculation means (for example, a calculation unit 210 to be described later) for acquiring a plurality of pieces of image data (for example, image data D1 to be described later) obtained by capturing a set of positions including a position of a fixed object (for example, a first characteristic point 10 to be described later) and a position of a movable part (for example, a second characteristic point 20 to be described later) of a machine tool (for example, a machine tool 400 to be described later) and calculating values of undefined numbers included in a predetermined conversion equation on the basis of the acquired plurality of pieces of image data; and first conversion means (for example, a first conversion unit 220 to be described later) for converting a coordinate value (for example, a machine-coordinate-system coordinate value D2 to be described later) in a first coordinate system which is a coordinate system for controlling driving of the movable part to a coordinate value (for example, an AR-coordinate-system coordinate value D4 to be described later) in a second coordinate system which is a coordinate system for representing virtual information and is a coordinate system based on the position of the fixed object on the basis of the predetermined conversion equation (for example, an undefined-number-calculation coordinate conversion equation D3 to be described later) of which the values of the undefined numbers are calculated by the calculation means.

According to the present invention, it is possible to perform a process for displaying virtual information appropriately.

BRIEF DESCRIPTION OF THE DRAWINGS

FIG. 1 is a diagram illustrating an overview of a process according to an embodiment of the present invention.

FIG. 4 is a flowchart illustrating a basic operation of an embodiment of the present invention.

FIG. 5 is a table illustrating a coordinate conversion equation according to an embodiment of the present invention.

FIG. 12 is a diagram illustrating a problem when a marker is placed on a movable part.

DETAILED DESCRIPTION OF THE INVENTION

Figure 2:
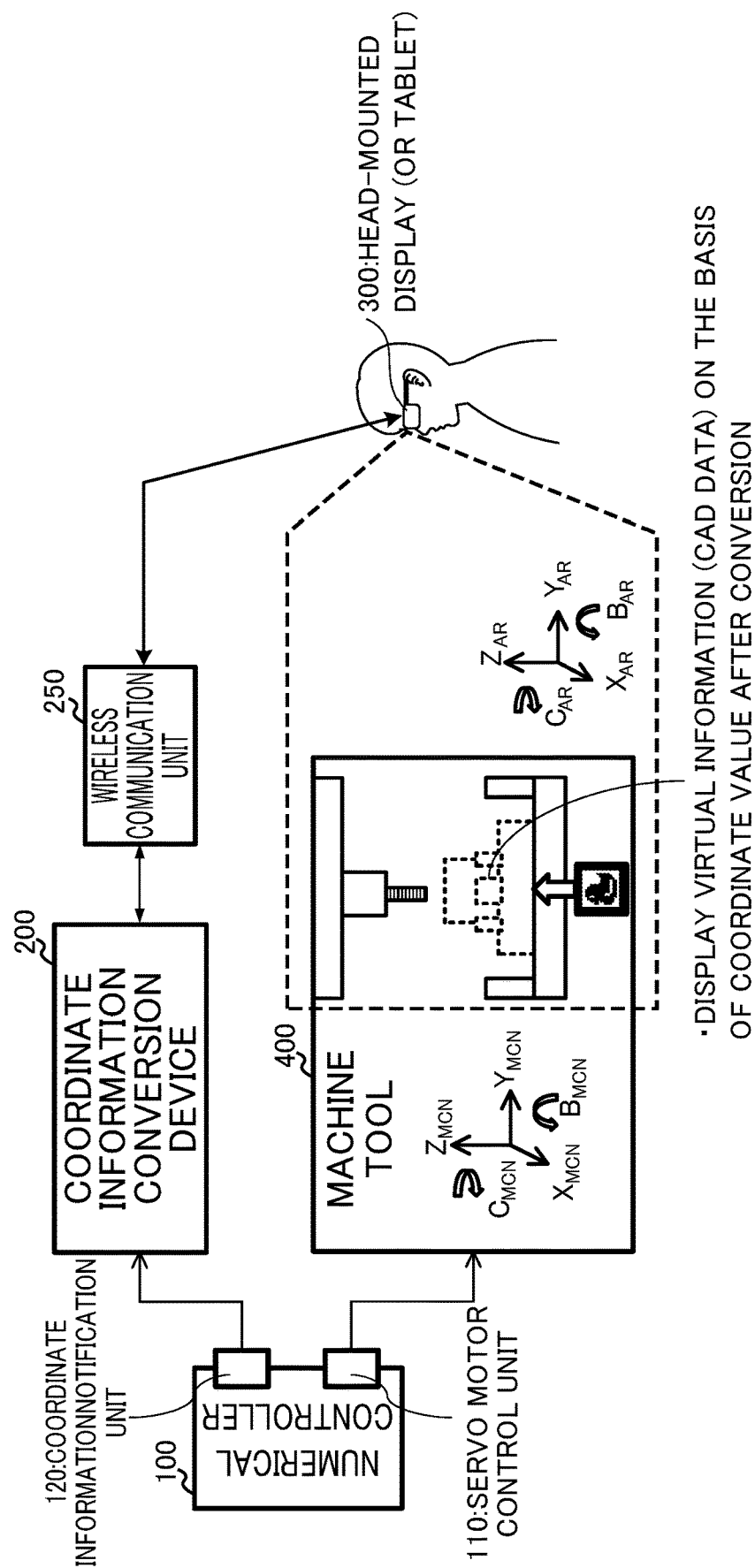
FIG. 2 is a diagram illustrating a basic configuration of an entire embodiment of the present invention.

First, an overview of an embodiment of the present invention will be described with reference to FIG. 1. In the embodiment of the present invention, a coordinate value in a coordinate system controlled by a numerical controller is interlocked with a display position on a camera image.

Therefore, in the embodiment of the present invention, a coordinate value in a coordinate system (hereinafter referred to as a "machine coordinate system") managed by a numerical controller is converted to a coordinate value in a coordinate system (hereinafter referred to as an "AR coordinate system") based on a characteristic point on a camera image. Specifically, as indicated by (1A) at the top of FIG. 1, image data obtained by capturing the position of a marker (a first characteristic point 10 in the drawing) for representing virtual information, fixed at a position visible from a camera and the position of a movable part (a second characteristic point 20 in the drawing) of a tool or the like that moves in a machine coordinate system is acquired a plurality of times. A predetermined conversion equation is solved on the basis of the position of the movable part in the AR coordinate system calculated from the acquired image data and the position of the tool at the coordinate value in the machine coordinate system.

According to the solved predetermined conversion equation, the coordinate value in the machine coordinate system is converted to a coordinate value in the AR coordinate system as indicated by (1B) at the bottom of FIG. 1. Moreover, the virtual information is represented on the basis of the coordinate value in the AR coordinate system, and the coordinate value in the AR coordinate system is converted to a coordinate value in a camera coordinate system in order to display the same on a camera image. Furthermore, the virtual information is displayed so as to be superimposed on an image of a real machine tool as an overlay on the basis of the converted coordinate value in the camera coordinate system.

In the embodiment of the present invention, due to such a configuration, it is possible to "perform a process for displaying virtual information appropriately." That is, according to the embodiment of the present invention, it is possible to solve the problems described above in section [SUMMARY OF THE INVENTION].

Hereinafter, an embodiment of the present invention will be described with reference to the drawings. First, an entire configuration of the present embodiment will be described with reference to FIG. 2. The present embodiment includes a numerical controller 100, a coordinate information conversion device 200, a wireless communication unit 250, a head-mounted display 300, and a machine tool 400.

The numerical controller 100 is a device having the function of a general numerical controller and a function of performing communication with the coordinate information conversion device 200. The numerical controller 100 includes a servo motor control unit 110 and a coordinate information notification unit 120. The numerical controller 100 is communicably connected to the machine tool 400 via the servo motor control unit 110. The numerical controller 100 controls driving of a movable part (for example, a tool) of the machine tool 400 according to a coordinate value in a machine coordinate system output on the basis of a machining program incorporated into the numerical controller 100 itself to machine a work.

Moreover, the numerical controller 100 is also communicably connected to the coordinate information conversion device 200 via the coordinate information notification unit 120. The numerical controller 100 also outputs a coordinate value in the machine coordinate system output on the basis of the machining program to the coordinate information conversion device 200. In this way, the numerical controller 100 outputs the coordinate value in the machine coordinate system to both the machine tool 400 and the coordinate information conversion device 200. The connection between the numerical controller 100 and the machine tool 400 or the coordinate information conversion device 200 may be realized by cable connection compliant to the Ethernet (registered trademark) and may be realized by wireless connection compliant to Wi-Fi or the like.

The coordinate information conversion device 200 is a device unique to the present embodiment and performs control for displaying virtual information appropriately by calculating a display position and a display angle of the virtual information using technologies such as AR or MR. In the following description, although it is assumed that a virtual 3D object is displayed as virtual information, other virtual information may be displayed. For example, a virtual 2D object may be displayed. The detailed configuration of the coordinate information conversion device 200 will be described with reference to FIG. 3.

The wireless communication unit 250 is communicably connected to the coordinate information conversion device 200 and acquires the virtual 3D object output by the coordinate information conversion device 200 and a display position and a display angle of the virtual 3D object. These pieces of information output by the coordinate information conversion device 200 correspond to a camera coordinate system. The wireless communication unit 250 transmits these pieces of information output by the coordinate information conversion device 200 to the head-mounted display 300 according to wireless connection compliant to Wi-Fi or the like.

Moreover, the wireless communication unit 250 receives image data generated by a camera capturing images, included in the head-mounted display 300, from the head-mounted display 300 by wireless communication. The wireless communication unit 250 outputs the received information to the coordinate information conversion device 200.

The head-mounted display 300 is a general head-mounted display (hereinafter referred to appropriately as an "HMD") and acquires the virtual 3D object output by the coordinate information conversion device 200 and the display position and the display angle thereof via the wireless communication unit 250. Moreover, the head-mounted display 300 displays the virtual 3D object on a display included in the head-mounted display 300 itself on the basis of the acquired information. The acquired information corresponds to the camera coordinate system as described above. Moreover, the head-mounted display 300 outputs the image data generated by the camera capturing images, included in the head-mounted display 300 itself to the coordinate information conversion device 200 via the wireless communication unit 250.

The machine tool 400 is a general machine tool and drives the control axis on the basis of a coordinate value in the machine coordinate system output from the numerical controller 100. Specifically, the machine tool 400 moves and rotates the control axis. In the drawings, since the machine tool 400 is driven on the basis of the coordinate values in the machine coordinate system, "$_{MCN}$" is appended at the end of respective axes such as "$X_{MCN}, Y_{MCN}, Z_{MCN}$" in order to conceptually indicate this. On the other hand, although the virtual information is displayed in the camera coordinate system, since the virtual information is originally represented on the basis of the coordinate value in the AR coordinate system, "$_{AR}$" is appended at the end of respective axes such as "$X_{AR}, Y_{AR}, Z_{AR}$" in order to indicate this.

In the present embodiment, due to such a configuration, a user refers to the virtual 3D object displayed so as to correspond to the AR coordinate system from the display of the head-mounted display 300 and refers to an actual structure of the machine tool 400 operating in correspondence to the machine coordinate system over the display. In this way, an advantage that the user can observe the state of machining simulation is obtained.

The configuration illustrated in FIG. 2 is an example only. For example, the head-mounted display 300 may be realized by other devices such as a tablet terminal rather than an HMD. Moreover, a portion or all of the functions of the coordinate information conversion device 200 may be mounted on the head-mounted display 300 or the numerical controller 100. Moreover, although the coordinate information conversion device 200 may be realized by a single device, the coordinate information conversion device 200 may be realized by a combination of a plurality of devices. Furthermore, although the coordinate information conversion device 200 may be realized by a device provided near the numerical controller 100 or the machine tool 400, the coordinate information conversion device 200 may be realized by a server device or the like provided at a distance and connected to the numerical controller 100 or the machine tool 400 via a network.

Figure 3:
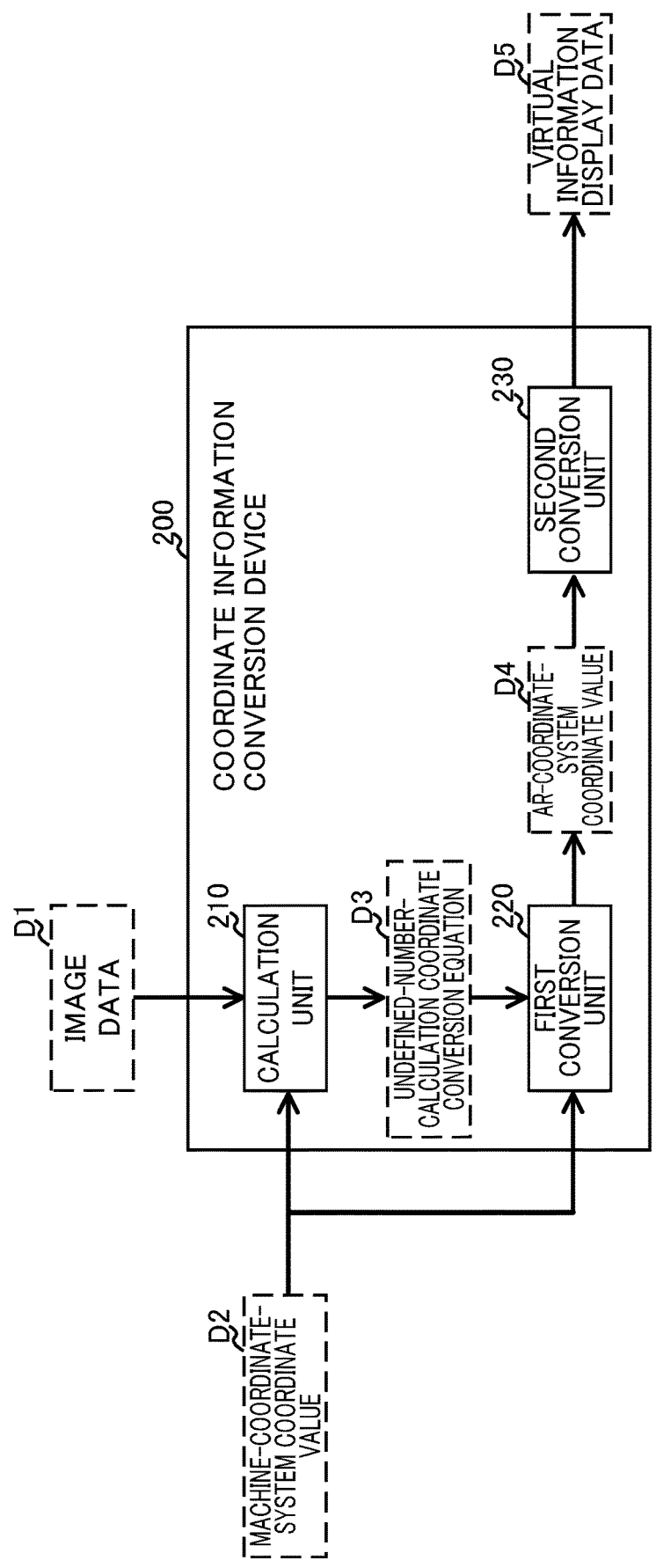
FIG. 3 is a block diagram illustrating a basic configuration of a coordinate information conversion device according to an embodiment of the present invention.

Next, a detailed configuration of the coordinate information conversion device 200 will be described with reference to FIG. 3. Referring to FIG. 3, the coordinate information conversion device 200 includes a calculation unit 210, a first conversion unit 220, and a second conversion unit 230.

The calculation unit 210 receives "image data D1" which is the image data generated by the camera capturing images, included in the head-mounted display 300, from the head-mounted display 300 via the wireless communication unit 250. Moreover, the calculation unit 210 also receives "machine-coordinate-system coordinate value D2" which is the coordinate value in the machine coordinate system output on the basis of the machining program from the coordinate information notification unit 120 of the numerical controller 100. The first conversion unit 220 to be described later also receives the machine-coordinate-system coordinate value D2 in a similar manner.

The calculation unit 210 stores a "coordinate conversion equation" which is an equation for converting a coordinate value in the machine coordinate system to a coordinate value in the AR coordinate system. The calculation unit 210 estimates and calculates the values of undefined numbers included in the coordinate conversion equation by substituting information based on the received image data D1 and information based on the received machine-coordinate-system coordinate value D2 into the coordinate conversion equation. Moreover, the calculation unit 210 outputs a coordinate conversion equation including the calculated values of the undefined numbers to the first conversion unit 220 as an "undefined-number-calculation coordinate conversion equation D3."

The first conversion unit 220 is a portion that converts the received machine-coordinate-system coordinate value D2 to an "AR-coordinate-system coordinate value D4" which is a coordinate value in the AR coordinate system. This conversion is performed using the undefined-number-calculation coordinate conversion equation D3 output by the calculation unit 210. The first conversion unit 220 outputs the AR-coordinate-system coordinate value D4 obtained by conversion to the second conversion unit 230. The details of the coordinate conversion equation, the calculation of the undefined numbers by the calculation unit 210, and the conversion by the first conversion unit 220 will be described in detail with reference to FIG. 5 and the like.

The second conversion unit 230 is a portion that generates "virtual information display data D5" which is data for displaying virtual information such as a virtual 3D object on the basis of technologies such as AR or MR.

More specifically, the second conversion unit 230 has a database (not illustrated) of virtual 3D objects inside or outside the second conversion unit 230. The second conversion unit 230 represents a virtual 3D object selected from this database so as to correspond to the AR-coordinate-system coordinate value D4 output by the first conversion unit 220. Moreover, the second conversion unit 230 converts the AR-coordinate-system coordinate value D4 to a coordinate value in the camera coordinate system which is a coordinate system for displaying the virtual 3D object. In this way, the second conversion unit 230 generates virtual information display data D5 for displaying the virtual 3D object represented on the basis of the AR-coordinate-system coordinate value D4 using the camera coordinate system. Since this process can be realized by using the technology disclosed in Non-Patent Document 1, for example, the detailed description thereof will be omitted.

The second conversion unit 230 transmits the generated virtual information display data D5 to the head-mounted display 300 via the wireless communication unit 250. The virtual information display data D5 includes a shape or the like of the virtual 3D object, a display position and a display angle converted to the coordinate value in the camera coordinate system, of the virtual 3D object, and the like. The head-mounted display 300 displays the virtual information such as the virtual 3D object on a display on the basis of the virtual information display data D5.

The coordinate information conversion device 200 can be realized by incorporating software unique to the present embodiment into a general server device or a personal computer.

More specifically, the coordinate information conversion device 200 includes an arithmetic processing device such as a central processing unit (CPU). Moreover, the coordinate information conversion device 200 includes an auxiliary storage device such as a hard disk drive (HDD) or a solid state drive (SSD) storing various programs and a main storage device such as a random access memory (RAM) for storing data which is temporarily necessary for the arithmetic processing device to execute programs.

Moreover, in the coordinate information conversion device 200, the arithmetic processing device reads various programs from the auxiliary storage device and performs an arithmetic process based on these programs while loading the read programs onto the main storage device.

The functions of the above-described functional blocks are realized by controlling hardware components included in the coordinate information conversion device 200 on the basis of the arithmetic processing result. That is, the coordinate information conversion device 200 can be realized by cooperation of software and hardware. Similarly, the numerical controller 100, the head-mounted display 300, and the like can be realized by cooperation of software and hardware.

Next, an entire operation of the present embodiment will be described with reference to the flowchart of FIG. 4 and the table of the coordinate conversion equation illustrated in FIG. 5. First, the calculation unit 210 specifies a coordinate conversion equation to be used at the present time on the basis of the number of linear axes and the number of rotation axes of the machine tool 400 that the numerical controller 100 drives according to a machining program (step S11).

Here, the coordinate conversion equation will be described with reference to FIG. 5. FIG. 5 is a diagram illustrating a table of coordinate conversion equations used by the calculation unit 210. As illustrated in FIG. 5, the coordinate conversion equation is different depending on the number of linear axes and the number of rotation axes. Therefore, the calculation unit 210 specifies a coordinate conversion equation to be used at the present time on the basis of the number of linear axes and the number of rotation axes by referring to such a table as illustrated in FIG. 5.

Here, as a method of allowing the calculation unit 210 to detect the number of linear axes and the number of rotation axes, the calculation unit 210 may detect the number of linear axes and the number of rotation axes by the user inputting the number of linear axes and the number of rotation axes to the coordinate information conversion device 200. As another method, the calculation unit 210 may detect the number of linear axes and the number of rotation axes, for example, by the numerical controller 100 inputting the number of linear axes and the number of rotation axes to the coordinate information conversion device 200.

Subsequently, the numerical controller 100 outputs the machine-coordinate-system coordinate value to the machine tool 400 whereby the tool (corresponding to the second characteristic point 20) of the machine tool 400 moves within a range where the tool can be captured by the head-mounted display 300 (step S12). This machine-coordinate-system coordinate value is also output to the calculation unit 210 as the machine-coordinate-system coordinate value D2.

On the other hand, the head-mounted display 300 captures a set of positions including the position of the tool (corresponding to the second characteristic point 20) of the machine tool 400 after movement and the position of the marker (corresponding to the first characteristic point 10) to generate the image data D1 and outputs the generated image data D1 to the calculation unit 210. The calculation unit 210 specifies the position of the tool and the position of the marker by analyzing the image data D1 and acquires the position of the tool in the AR coordinate system by calculating a difference between the specified positions (step S13).

Subsequently, the calculation unit 210 determines whether steps S12 and S13 have been executed for times necessary to calculate the undefined numbers included in the coordinate conversion equation (step S14). Here, the necessary time is determined according to the number of linear axes and the number of rotation axes. For example, if the number of linear axes is 4 and the number of rotation axes is 0, the necessary time is 4.

If steps S12 and S13 have not been executed for the necessary times (step S14: No), the flow returns to step S12, and the processes of steps S12 and 13 are executed again. On the other hand, if steps S12 and S13 have been executed for the necessary times (step S14: Yes), the flow proceeds to step S15.

In step S15, the calculation unit 210 substitutes the position of the tool based on the machine-coordinate-system coordinate value D2 input in step S12 and the position of the tool in the AR coordinate system calculated in step S13 into the coordinate conversion equation to thereby estimate and calculate the undefined numbers included in the conversion matrix in the coordinate conversion equation (step 15). In this way, the calculation unit 210 generates the undefined-number-calculation coordinate conversion equation D3 and outputs the generated undefined-number-calculation coordinate conversion equation D3 to the first conversion unit 220.

Subsequently, the first conversion unit 220 converts the machine-coordinate-system coordinate value D2 output by the numerical controller 100 to a coordinate value in the AR coordinate system according to the undefined-number-calculation coordinate conversion equation D3 output by the calculation unit 210 (step S16). The first conversion unit 220 outputs the AR-coordinate-system coordinate value D4 obtained by conversion to the second conversion unit 230.

Subsequently, the second conversion unit 230 represents the virtual 3D object selected from the database so as to correspond to the AR-coordinate-system coordinate value D4 output by the first conversion unit 220 as described above. Moreover, the second conversion unit 230 converts the AR-coordinate-system coordinate value D4 to a coordinate value in the camera coordinate system which is a coordinate system for displaying the virtual 3D object (step S17).

In this way, the second conversion unit 230 generates the virtual information display data D5 for displaying the virtual 3D object represented on the basis of the AR-coordinate-system coordinate value D4 using the camera coordinate system (step S18). The second conversion unit 230 transmits the generated virtual information display data D5 to the head-mounted display 300 via the wireless communication unit 250.

The head-mounted display 300 receives the virtual information display data D5. The head-mounted display 300 displays the virtual information on a display included in the head-mounted display 300 on the basis of the received virtual information display data D5 (step S19). After that, the flow returns to step S16, and the processes subsequent to step S16 are repeated with respect to new machine-coordinate-system coordinate value D2 output by the numerical controller 100. By this repetition, the virtual information displayed on the display is moved on the basis of the new machine-coordinate-system coordinate value D2.

Hereinabove, the present embodiment has been described. According to the present embodiment described above, the user can refer to the virtual 3D object represented so as to correspond to the AR coordinate system on the display of the head-mounted display 300. Moreover, the user can refer to an actual structure of the tool 400 operating in correspondence to the coordinate value in the machine coordinate system over the display.

In this way, an advantage that the user can observe the state of machining simulation is obtained. Moreover, in the present embodiment, an advantage that the user does not need to set relational information between the machine coordinate system and the AR coordinate system individually is obtained.

Next, a specific example of the present embodiment described above will be described as [Example 1] and [Example 2]. Since basic configuration and operations of these two examples are the same as the configuration and operations of the present embodiment described above, redundant description thereof will be omitted. Moreover, although these two examples are described separately, these two examples may be combined.

Example 1

In Example 1, a coordinate conversion equation when the number of linear axes is n (n is an arbitrary natural number) and the number of rotation axes is 0 will be described in detail. In the following description, "(bold)" is appended to letters in a bold font appearing in respective equations.

<Coordinate Conversion Equation when Number of Linear Axes is n and Number of Rotation Axes is 0>

First, when the origin is defined as a point at which the values on all axes are 0, a coordinate system X(bold)nc at this origin is expressed as the following equation (Formula. 1).

$$Xnc = x + T1 + T2 + \ldots + Tn \quad \text{[Formula. 1]}$$

Moreover, an AR coordinate system X(bold)ar is expressed as the following equation [Formula. 2] using the coordinate system X(bold)nc.

$$Xar = RXnc + T \quad \text{[Formula. 2]}$$

These equations [Formula. 1] and [Formula. 2] correspond to the coordinate conversion equation illustrated in FIG. 5. Furthermore, the respective matrices are expressed as the following equations [Formula. 3].

$$Xnc = \begin{pmatrix} Xnc \\ Ync \\ Znc \end{pmatrix}$$

$$Xar = \begin{pmatrix} Xar \\ Yar \\ Zar \end{pmatrix}$$

$$x = \begin{pmatrix} l \\ m \\ n \end{pmatrix}$$

$$Tn = \begin{pmatrix} a1nxn \\ a2nxn \\ a3nxn \end{pmatrix}$$

$$T = \begin{pmatrix} b1 \\ b2 \\ b3 \end{pmatrix}$$

$$R = \begin{pmatrix} c11 & c12 & c13 \\ c21 & c22 & c23 \\ c31 & c32 & c33 \end{pmatrix} \quad \text{[Formula. 3]}$$

Here, l, m, n, a*b, b*, and c** in the equations [Formula. 3] are constants. Moreover, xn in the equations [Formula. 3] is the position of the linear axis and is a variable.

When the coordinate system X(bold)nc is computed, the following equation [Formula. 4] is obtained.

$$\begin{pmatrix} Xnc \\ Ync \\ Znc \end{pmatrix} = \begin{pmatrix} l \\ m \\ n \end{pmatrix} + \begin{pmatrix} a11x1 + a12x2 + \ldots + a1nxn \\ a21x1 + a22x2 + \ldots + a2nxn \\ a31x1 + a32x2 + \ldots + a3nxn \end{pmatrix}$$

$$= \begin{pmatrix} a11x1 + a12x2 + \ldots + a1nxn + l \\ a21x1 + a22x2 + \ldots + a2nxn + m \\ a31x1 + a32x2 + \ldots + a3nxn + n \end{pmatrix} \quad \text{[Formula. 4]}$$

From the equation [Formula. 4], the AR coordinate system X(bold)ar is obtained as the following equation [Formula. 5].

$$\begin{pmatrix} Xar \\ Yar \\ Zar \end{pmatrix} =$$

$$\begin{pmatrix} c11 & c12 & c13 \\ c21 & c22 & c23 \\ c31 & c32 & c33 \end{pmatrix} \begin{pmatrix} a11x1 + a12x2 + \ldots + a1nxn + l \\ a21x1 + a22x2 + \ldots + a2nxn + m \\ a31x1 + a32x2 + \ldots + a3nxn + n \end{pmatrix} + \quad \text{[Formula. 5]}$$

-continued $$\begin{pmatrix} b1 \\ b2 \\ b3 \end{pmatrix} \begin{pmatrix} (c11a11+c12a21+c13a31)x1+\ldots+ \\ (c11a1n+c12a2n+c13a3n)xn+ \\ (c11l+c12m+c13n+b1) \\ (c21a11+c22a21+c23a31)x1+\ldots+ \\ (c21a1n+c22a2n+c23a3n)xn+ \\ (c21l+c22m+c23n+b2) \\ (c31a11+c32a21+c33a31)x1+\ldots+ \\ (c31a1n+c32a2n+c33a3n)xn+ \\ (c31l+c32m+c33n+b3) \end{pmatrix}$$

$$\begin{pmatrix} r11x1+\ldots+r1nxn+t1 \\ r21x1+\ldots+r2nxn+t2 \\ r31x1+\ldots+r3nxn+t3 \end{pmatrix}$$

Here, r1n, r2n, r3n, t1, t2, and t3 in the equation [Formula. 5] are expressed as the following equations [Formula. 6].

$r1n=c11a1n+c12a2n+c13a3n$ $r2n=c21a1n+c22a2n+c23a3n$ $r3n=c31a1n+c32a2n+c33a3n$ $t1=c11l+c12m+c13n+b1$ $t2=c21l+c22m+c23n+b2$ $t3=c31l+c32m+c33n+b3$  [Formula. 6]

Figure 6:
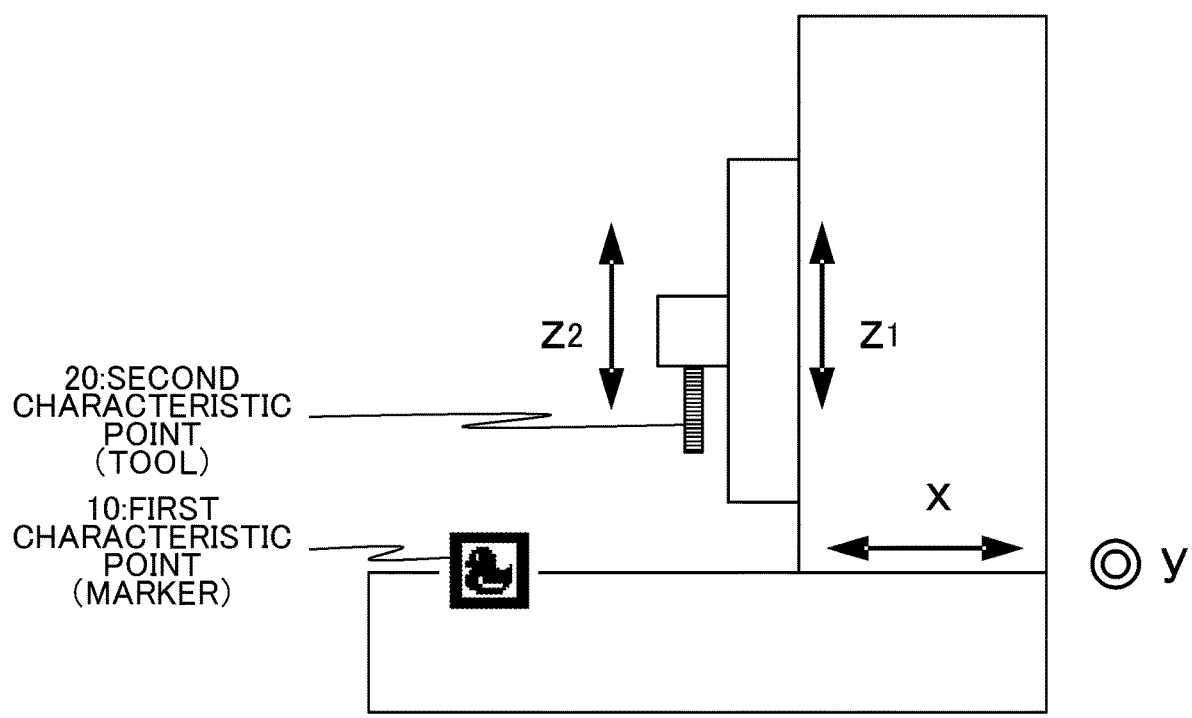
FIG. 6 is a diagram for describing Example 1 of the present invention.

Next, the coordinate conversion equation will be described in detail with reference to FIG. 6 by way of an example of a case in which the number of linear axes is 4 and the number of rotation axes is 0. Here, as illustrated in FIG. 6, in this example, the number of linear axes is 1 for the X-axis, 1 for the Y-axis, and 2 (Z1 and Z2) for the Z-axis. That is, the total number of linear axes is 4. Although a case in which the number of linear axes is 4 is described at the present time, the number of linear axes may be 3 or smaller and may be 5 or more.

First, the coordinate conversion equation to be used is specified on the basis of the information that the number of linear axes is 4 and the number of rotation axes is 0 (step S11). As described above, the present linear axes are X, Y, Z1, and Z2. Due to this, the coordinate conversion equation is expressed as the following equation [Formula. 7] using the machine coordinate system [x, y, z1, z2], the AR coordinate system [Xar, Yar, Zar], and the equation [Formula. 5].

$$\begin{pmatrix} Xar \\ Yar \\ Zar \end{pmatrix} = \begin{pmatrix} r11x+r12y+r13z1+r14z2+t1 \\ r21x+r22y+r23z1+r24z2+t2 \\ r31x+r32y+r33z1+r24z2+t3 \end{pmatrix}$$  [Formula. 7]

Subsequently, steps S12 and S13 are executed four times (step S14: No), and four simultaneous equations are generated. Using the generated simultaneous equations, the values of [r11, r12, r13, r14, t1, ~, t4] which are undefined numbers are estimated and calculated (step S15).

After that, by repeating the processes of steps S16 to S19 as described above, the same advantage as the above-described embodiment that the user can observe the state of machining simulation appropriately is obtained.

Example 2

In Example 2, a coordinate conversion equation when the number of linear axes is n and the number of rotation axes is 1 will be described in detail. In the following description, a case in which a rotation axis B around the Y-axis which is a linear axis is a rotation axis is described. For example, using a similar coordinate conversion equation, the present embodiment can be applied to a case in which a rotation axis A around the X-axis which is a linear axis is a rotation axis.

<Coordinate Conversion Equation when Number of Linear Axes is n and Number of Rotation Axes is 1>

First, when an origin is defined as the center of rotation, a coordinate system X(bold)nc at this origin is expressed as the following equation [Formula. 8].

$Xnc=Ryx+T1+T2+\ldots+Tn$  [Formula. 8]

In this case, an AR coordinate system X(bold)ar is expressed as the following equation [Formula. 9] using the coordinate system X(bold)nc.

$Xar=RXnc+T$  [Formula. 9]

These equations [Formula. 8] and [Formula. 9] correspond to the coordinate conversion equation illustrated in FIG. 5 similarly to the equations [Formula. 1] and [Formula. 2]. Furthermore, the respective matrices of these equations [Formula. 8] and [Formula. 9] are expressed as the equations [Formula. 3]. Moreover, R(bold)y is expressed as the following equation [Formula. 10].

$$Ry = \begin{pmatrix} \cos B & 0 & \sin B \\ 0 & 1 & 0 \\ -\sin B & 0 & \cos B \end{pmatrix}$$  [Formula 10]

Here, B in the equation [Formula. 10] is the position of the rotation axis and is a variable.

When the coordinate system X(bold)nc is computed, the following equation [Formula. 11] is obtained.

$$\begin{pmatrix} Xnc \\ Ync \\ Znc \end{pmatrix} =$$  [Formula 11]

$$\begin{pmatrix} \cos B & 0 & \sin B \\ 0 & 1 & 0 \\ -\sin B & 0 & \cos B \end{pmatrix} \begin{pmatrix} l \\ m \\ n \end{pmatrix} + \begin{pmatrix} a11x1+a12x2+\ldots+a1nxn \\ a21x1+a22x2+\ldots+a2nxn \\ a31x1+a32x2+\ldots+a3nxn \end{pmatrix}$$

$$\begin{pmatrix} a11x1+a12x2+\ldots+a1nxn+l\cos B+n\sin B \\ a21x1+a22x2+\ldots+a2nxn+m \\ a31x1+a32x2+\ldots+a3nxn-l\sin B+n\cos B \end{pmatrix}$$

Here, the addition theorem is illustrated as equations [Formula. 12].

$\sin(A+B)=\sin A \cos B+\cos A \sin B$ $\cos(A+B)=\cos A \cos B-\sin A \sin B$  [Formula. 12]

When the addition theorem is used, the following equations [Formula. 13] are obtained.

$\sin(B+\theta) = l\cos B + n\sin B$  [Formula. 13]

-continued
$$\cos(B+\theta) = -l\sin B + n\cos B$$
$$\tan\theta = \frac{l}{n}$$

Moreover, θ is a value illustrated in the following equation [Formula. 14].

$$\theta = \tan^{-1}\frac{l}{n} \qquad [\text{Formula 14}]$$

Therefore, the coordinate system X(bold)nc is expressed as the following equation [Formula. 15].

$$\begin{pmatrix} Xnc \\ Ync \\ Znc \end{pmatrix} = \begin{pmatrix} a11x1 + a12x2 + \ldots + a1nxn + \sin(B+\theta) \\ a21x1 + a22x2 + \ldots + a2nxn + m \\ a31x1 + a32x2 + \ldots + a3nxn + \cos(B+\theta) \end{pmatrix} \qquad [\text{Formula 15}]$$

From the equation [Formula. 15], the AR coordinate system X(bold)ar is obtained as the following equation [Formula. 16].

$$\begin{pmatrix} Xar \\ Yar \\ Zar \end{pmatrix} = \begin{pmatrix} c11 & c12 & c13 \\ c21 & c22 & c23 \\ c31 & c32 & c33 \end{pmatrix} \qquad [\text{Formula 16}]$$

$$\begin{pmatrix} a11x1 + a12x2 + \ldots + a1nxn + \sin(B+\theta) \\ a21x1 + a22x2 + \ldots + a2nxn + m \\ a31x1 + a32x2 + \ldots + a3nxn + \cos(B+\theta) \end{pmatrix} +$$

$$\begin{pmatrix} b1 \\ b2 \\ b3 \end{pmatrix} \begin{pmatrix} (c11a11 + c12a21 + c13a31)x1 + \ldots + \\ (c11a1n + c12a2n + c13a3n)xn + \\ (c11\sin(B+\theta) + c12m + c13\cos(B+\theta) + b1) \\ (c21a11 + c22a21 + c23a31)x1 + \ldots + \\ (c21a1n + c22a2n + c23a3n)xn + \\ (c21\sin(B+\theta) + c22m + c23\cos(B+\theta) + b2) \\ (c31a11 + c32a21 + c33a31)x1 + \ldots + \\ (c31a1n + c32a2n + c33a3n)xn + \\ (c31\sin(B+\theta) + c32m + c33\cos(B+\theta) + b3) \end{pmatrix}$$

$$\begin{pmatrix} r11x1 + \ldots + r1nxn + t1 + c11\sin(B+\theta) + c13\cos(B+\theta) \\ r21x1 + \ldots + r2nxn + t2 + c21\sin(B+\theta) + c23\cos(B+\theta) \\ r31x1 + \ldots + r3nxn + t3 + c31\sin(B+\theta) + c33\cos(B+\theta) \end{pmatrix}$$

Here, r1n, r2n, r3n, t1, t2, and t3 in the equation are expressed as the following equations [Formula. 17].

$$r1n = c11a1n + c12a2n + c13a3n$$

$$r2n = c21a1n + c22a2n + c23a3n$$

$$r3n = c31a1n + c32a2n + c33a3n$$

$$t1 = c12m + b1$$

$$t2 = c22m + b2$$

$$t3 = c32m + b3 \qquad [\text{Formula 17}]$$

Here, when the addition theorem illustrated in as the equations [Formula. 12] is used, the following equations [Formula. 18] are obtained.

$$\sin(B + \varphi 1) = \qquad [\text{Formula 18}]$$
$$\sin(B + \theta + \mu 1) = c11\sin(B+\theta) + c13\cos(B+\theta)$$

$$\sin(B + \varphi 2) = \sin(B + \theta + \mu 2) =$$
$$c21\sin(B+\theta) + c23\cos(B+\theta)$$

$$\sin(B + \varphi 3) = \sin(B + \theta + \mu 3) =$$
$$c31\sin(B+\theta) + c33\cos(B+\theta)$$

$$\tan\mu 1 = \frac{c13}{c11}$$

$$\tan\mu 2 = \frac{c23}{c21}$$

$$\tan\mu 3 = \frac{c33}{c31}$$

Moreover, φ1, φ2, and φ3 in the equations [Formula. 18] have values indicated in the following equations [Formula. 19].

$$\varphi 1 = \theta + \mu 1 = \tan^{-1}\frac{l}{n} + \tan^{-1}\frac{c13}{c11} \qquad [\text{Formula 19}]$$

$$\varphi 2 = \theta + \mu 2 = \tan^{-1}\frac{l}{n} + \tan^{-1}\frac{c23}{c21}$$

$$\varphi 3 = \theta + \mu 3 = \tan^{-1}\frac{l}{n} + \tan^{-1}\frac{c33}{c31}$$

Therefore, the AR coordinate system X(bold)ar is obtained as the following equation [Formula. 20].

$$\begin{pmatrix} Xar \\ Yar \\ Zar \end{pmatrix} = \begin{pmatrix} r11x1 + \ldots + r1nxn + t1 + \sin(B+\varphi 1) \\ r21x1 + \ldots + r2nxn + t2 + \sin(B+\varphi 2) \\ r31x1 + \ldots + r3nxn + t3 + \sin(B+\varphi 3) \end{pmatrix} \qquad [\text{Formula 20}]$$

Figure 7:
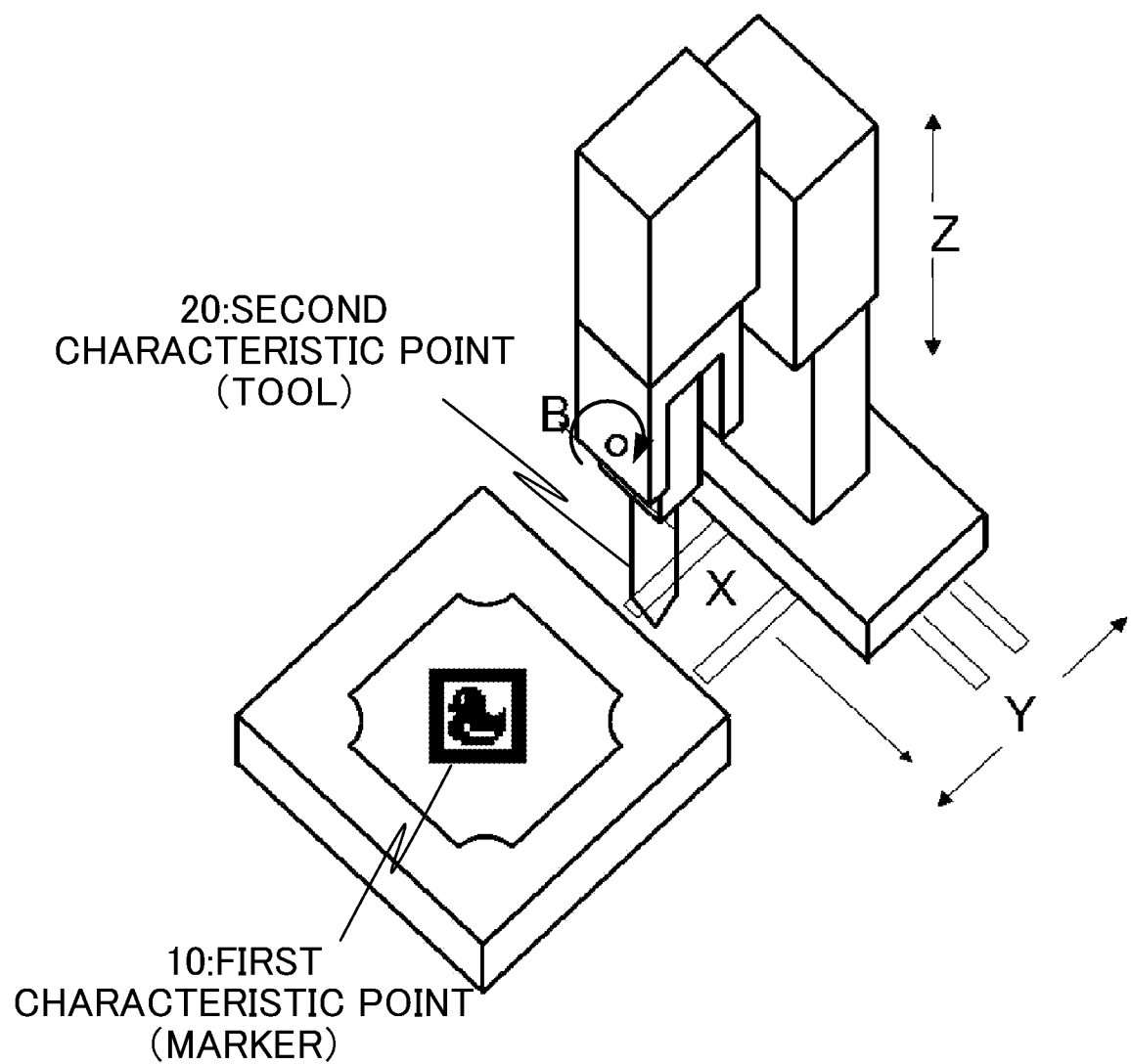
FIG. 7 is a diagram for describing Example 2 of the present invention.

Next, the coordinate conversion equation will be described in detail with reference to FIG. 7 by way of an example of a case in which the number of linear axes is 3 and the number of rotation axes is 1. Here, as illustrated in FIG. 7, in this example, the number of linear axes is 1 for the X-axis, 1 for the Y-axis, and 1 for the Z-axis, and the number of rotation axes is 1 (B). That is, the total number of linear axes is 3 and the number of rotation axes is 1. Although a case in which the number of linear axes is 3 is described at the present time, the number of linear axes may be 2 or smaller and may be 4 or more.

First, the coordinate conversion equation to be used is specified on the basis of the information that the number of linear axes is 3 and the number of rotation axes is 1 (step S11). As described above, the present linear axes are X, Y, and Z, the rotation axis is B. Due to this, the coordinate conversion equation is expressed as the following equation

[Formula. 21] using the machine coordinate system [x, y, z, B], the AR coordinate system [Xar, Yar, Zar], and the equation [Formula. 20].

"sin" in the drawing may be replaced with "cos."

$$\begin{pmatrix} Xar \\ Yar \\ Zar \end{pmatrix} = \begin{pmatrix} r11x + r12y + r13z + t1 + \sin(B + \phi1) \\ r21x + r22y + r23z + t2 + \sin(B + \phi2) \\ r31x + r32y + r33z + t3 + \sin(B + \phi3) \end{pmatrix}$$ [Formula 21]

Subsequently, steps S12 and S13 are executed four times (step S14: No), and four simultaneous equations are generated. Using the generated simultaneous equations, the values of [r11, r12, r13, r14, t1, φ1, ~, φ3] which are undefined numbers are estimated and calculated (step S15).

After that, by repeating the processes of steps S16 to S19 as described above, the same advantage as the above-described embodiment that the user can observe the state of machining simulation appropriately is obtained.

Hereinabove, the present embodiment has been described. The above-described embodiment is a preferred embodiment of the present invention. However, the scope of the present invention is not limited to the embodiment only but the present invention can be embodied in various modifications without departing from the spirit of the present invention.

For example, in the embodiment and the respective examples described above, it is assumed that the virtual 3D object of a virtual work or the like is displayed as the virtual information by performing the processes of steps S11 to S19. However, other information may be displayed as the virtual information by performing the processes of steps S11 to S19. That is, arbitrary information represented by the coordinate values in the machine coordinate system may be displayed as the virtual information.

For example, the numerical controller 100 may store a movable range of a tool as a limit position of a stored stroke check function. The stored stroke check function is a function of outputting an alarm or the like and decelerating and stopping a tool when the tool actually moves into this movable range.

Figure 8:
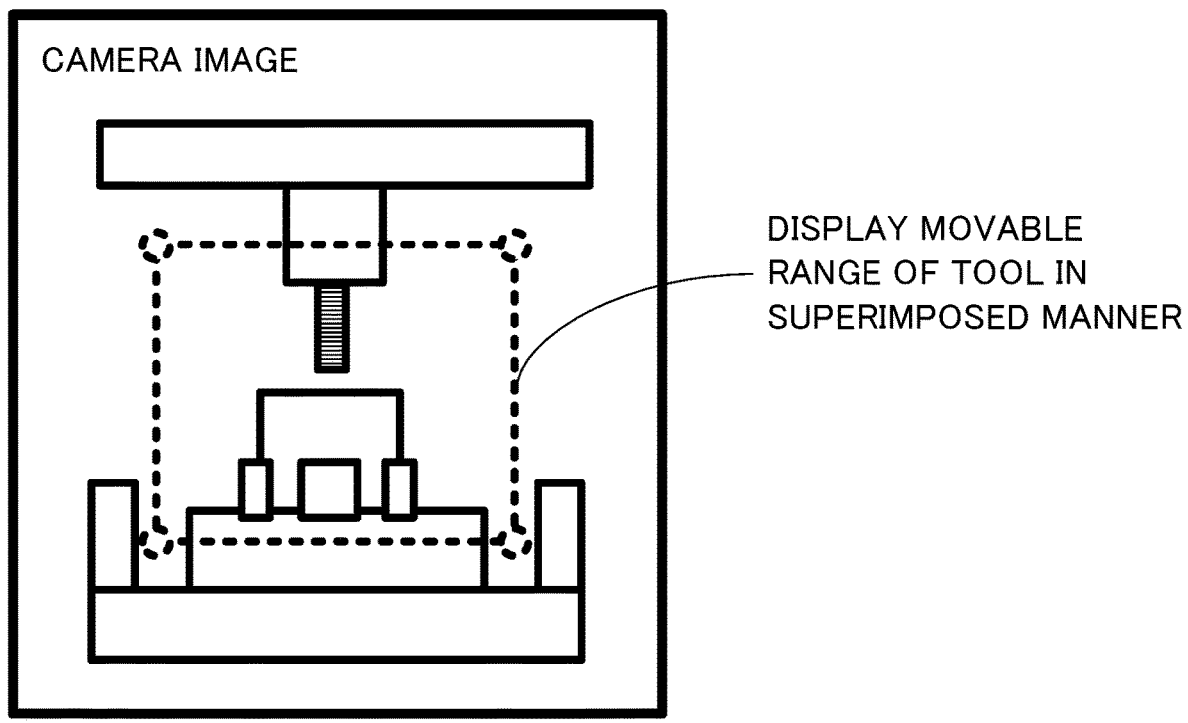
FIG. 8 is a diagram for describing Modification 2 of the present invention.
Figure 9:
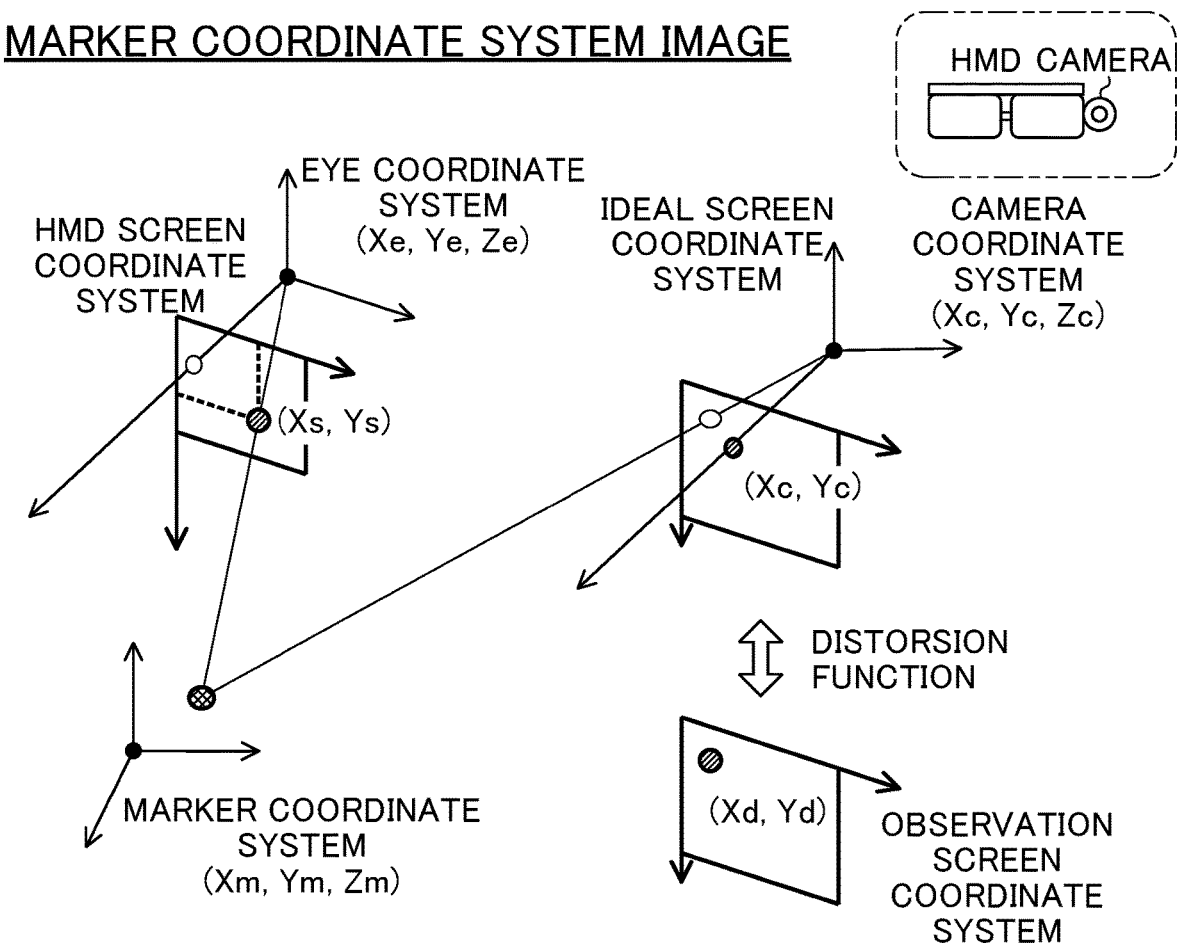
FIG. 9 is a diagram illustrating a marker coordinate system.
Figure 10:
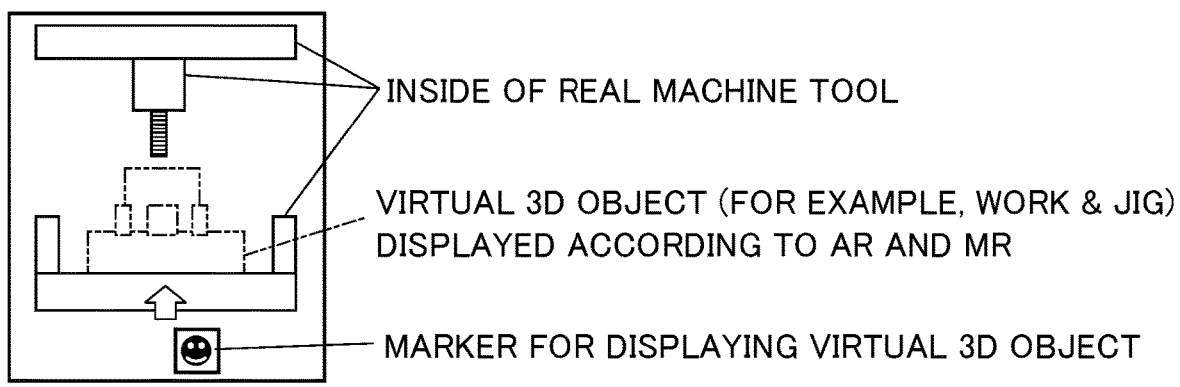
FIG. 10 is a diagram illustrating display of a virtual 3D object.
Figure 11:
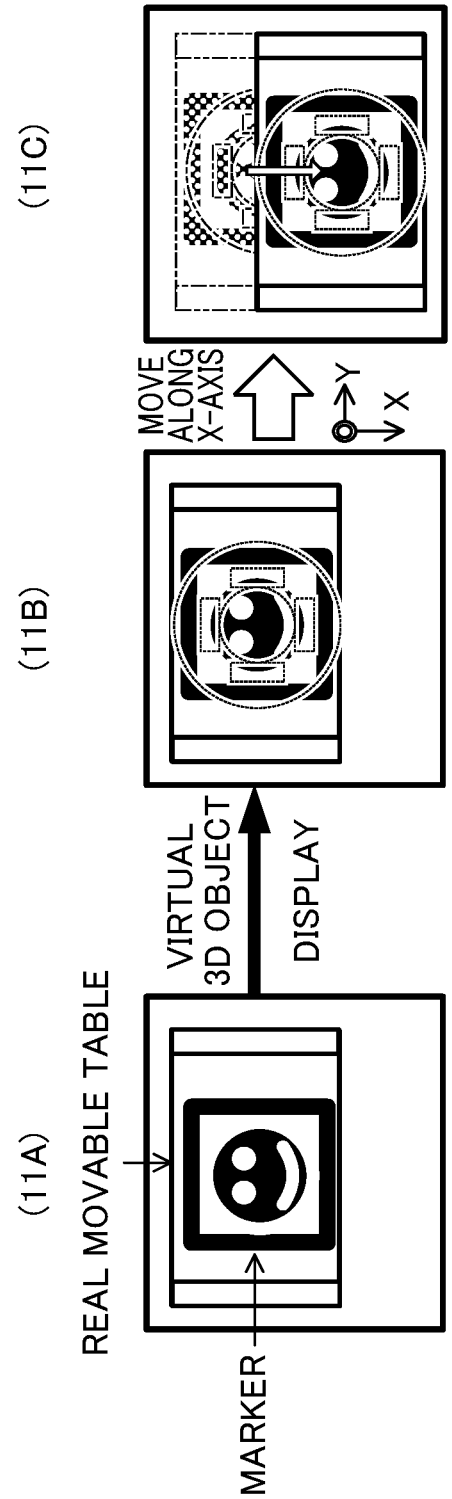
FIG. 11 is a diagram illustrating a case in which a marker is placed on a movable part.

This function may be combined with the embodiment and the respective examples described above. Specifically, the coordinate value in the machine coordinate system corresponding to this movable range is converted to the coordinate value in the camera coordinate system. In this way, as illustrated by a broken line in FIG. 8, the movable range of the tool is displayed so as to be superimposed on the real machine tool 400 as the virtual information. In this way, the user can visually recognize the movable range even when the tool is not moved actually.

As another modification, when machining simulation is performed, the machine-coordinate-system coordinate value may not be output to the machine tool 400. In this way, it is possible to move a virtual 3D object only without moving a real movable part of the machine tool 400.

Note that the above-described numerical controller, the coordinate information conversion device, and the machine tool can be realized respectively by hardware, software, or a combination thereof. Moreover, the coordinate information conversion program performed by cooperation of the above-described numerical controller, the coordinate information conversion device, and the machine tool can also be realized by hardware, software, or a combination thereof. Here, being realized by software means being realized when a computer reads and executes a program.

The programs can be stored on any of various types of non-transitory computer readable media and be provided to a computer. The non-transitory computer readable media include various types of tangible storage media. Examples of the non-transitory computer readable media include a magnetic recording medium (for example a flexible disk, a magnetic tape, and a hard disk drive), a magneto-optical recording medium (for example a magneto-optical disk), a CD-ROM (Read Only Memory), a CD-R, a CD-R/W, a semiconductor memory (for example a mask ROM, a PROM (Programmable ROM), an EPROM (Erasable PROM), a flash ROM, and a RAM (Random Access Memory)). The programs may be provided to a computer by using any of various types of transitory computer readable media. Examples of the transitory computer readable media include electric signals, optical signals and electromagnetic waves. A transitory computer readable medium can provide programs to a computer through a wired communication path such as an electrical cable, optical fiber, or the like or a wireless communication path.

EXPLANATION OF REFERENCE NUMERALS

10: First characteristic point
20: Second characteristic point
100: Numerical controller
200: Coordinate information conversion device
210: Calculation unit
220: First conversion unit
230: Second conversion unit
250: Wireless communication unit
300: Head-mounted display
400: Machine tool

What is claimed is:

1. A coordinate information conversion device comprising:
   calculation means for specifying a conversion equation to be used from among a plurality of conversion equations on the basis of a number of linear axes and a number of rotation axes of a machine tool, acquiring a plurality of pieces of image data obtained by capturing a set of positions including a position of a fixed object and a position of a movable part of the machine tool and calculating values of undefined numbers included in the specified conversion equation on the basis of the acquired plurality of pieces of image data; and
   first conversion means for converting a coordinate value in a first coordinate system to a coordinate value in a second coordinate system on the basis of the specified conversion equation of which the values of the undefined numbers are calculated by the calculation means,
   the first coordinate system being a coordinate system for controlling driving of the movable part of the machine tool,
   the second coordinate system being a coordinate system for representing virtual information,
   the second coordinate system being a coordinate system that is based on the position of the fixed object, and
   wherein the fixed object is a marker that is fixedly placed at a predetermined position on the movable part of the machine tool to indicate where a superimposed virtual image of a virtual three-dimensional object is to be positioned for display as an overlay on the machine tool so that machine simulation can be performed, the machine tool being in a non-virtual form.

2. The coordinate information conversion device according to claim 1, further comprising:
second conversion means for representing the virtual information on the basis of the coordinate value in the second coordinate system converted by the first conversion means and converting the coordinate value in the second coordinate system converted by the first conversion means to a coordinate value in a third coordinate system which is a coordinate system for displaying the virtual information to thereby generate display data for displaying the virtual information in the third coordinate system; and
display means for displaying the configuration information on the basis of the display data generated by the second conversion means.

3. The coordinate information conversion device according to claim 2, wherein
when the movable part of the machine tool is driven by transmitting the coordinate value in the first coordinate system to the machine tool,
the first conversion means converts a coordinate value that is the same as the coordinate value in the first coordinate system transmitted to the machine tool to a coordinate value in the second coordinate system, and
the display means displays the virtual information on the basis of the display data converted to the third coordinate system so as to be interlocked with the driving of the movable part of the machine tool.

4. The coordinate information conversion device according to claim 1, wherein
when the position of the fixed object is a first characteristic point and the position of the movable part is a second characteristic point,
the calculation means calculates the values of the undefined numbers included in the specified conversion equation by substituting a coordinate value in the second coordinate system and the coordinate value in the first coordinate system into the specified conversion equation,
the coordinate value in the second coordinate system being calculated on the basis of a difference between the first characteristic point and the second characteristic point, and
the coordinate value in the first coordinate system being the coordinate value that is transmitted to the machine tool.

5. The coordinate information conversion device according to claim 1, wherein
the movable part performs rotational movement on the basis of the coordinate value in the first coordinate system,
the specified conversion equation further includes an undefined number value corresponding to the rotational movement of the movable part, and
the first conversion means converts the coordinate value in the first coordinate system to the coordinate value in the second coordinate system on the basis of the specified conversion equation in which the values of all undefined numbers are calculated by the calculation means, wherein the values of all undefined numbers include the value of the undefined number corresponding to the rotational movement of the movable part.

6. The coordinate information conversion device according to claim 1, wherein
the fixed object can be placed in an arbitrary place within a capturing range of a capturing device that performs the capturing.

7. A non-transitory computer readable medium having recorded thereon a coordinate information conversion program for causing a computer to function as a coordinate information conversion device,
the coordinate information conversion program causing the computer to function as the coordinate information conversion device comprising:
calculation means for specifying a conversion equation to be used from among a plurality of conversion equations on the basis of a number of linear axes and a number of rotation axes of a machine tool, acquiring a plurality of pieces of image data obtained by capturing a set of positions including a position of a fixed object and a position of a movable part of the machine tool, and calculating values of undefined numbers included in the specified conversion equation on the basis of the acquired plurality of pieces of image data; and
first conversion means for converting a coordinate value in a first coordinate system to a coordinate value in a second coordinate system on the basis of the specified conversion equation of which the values of the undefined numbers are calculated by the calculation means,
the first coordinate system being a coordinate system for controlling driving of the movable part of the machine tool,
the second coordinate system being a coordinate system for representing virtual information,
the second coordinate system being a coordinate system that is based on the position of the fixed object, and
wherein the fixed object is a marker that is fixedly placed at a predetermined position on the movable part of the machine tool to indicate where a superimposed virtual image of a virtual three-dimensional object is to be positioned for display as an overlay on the machine tool so that machine simulation can be performed, the machine tool being in a non-virtual form.

* * * * *